(12) United States Patent
Kawagishi et al.

(10) Patent No.: US 7,741,884 B2
(45) Date of Patent: Jun. 22, 2010

(54) LOAD DRIVE CIRCUIT

(75) Inventors: Norihiro Kawagishi, Tokyo (JP); Kazuyoshi Asakawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 9 days.

(21) Appl. No.: 12/327,174

(22) Filed: Dec. 3, 2008

(65) Prior Publication Data

US 2009/0153200 A1 Jun. 18, 2009

(30) Foreign Application Priority Data

Dec. 12, 2007 (JP) .............................. 2007-320808

(51) Int. Cl.
*H03K 3/00* (2006.01)
(52) U.S. Cl. ...................... 327/108; 327/309; 327/314; 327/325; 361/91.1; 361/91.6
(58) Field of Classification Search ........................ None
See application file for complete search history.

(56) References Cited

U.S. PATENT DOCUMENTS 5,086,364 A * 2/1992 Leipold et al. ................ 361/18

7,176,744 B2 * 2/2007 Goudo ........................ 327/434
2007/0222485 A1 * 9/2007 Ueda ........................... 327/108

FOREIGN PATENT DOCUMENTS

JP 2005323489 11/2005
JP 2006157400 6/2006

OTHER PUBLICATIONS

B. Razavi, and translation and supervision by Tadahiro Kuroda, "Design of Analog CMOS Integrated Circuit," Maruzen, Mar. 30, 2003.

* cited by examiner

*Primary Examiner*—An T Luu
(74) *Attorney, Agent, or Firm*—Volentine & Whitt, P.L.L.C.

(57) ABSTRACT

A load drive circuit which can operate at high speed with low consumption current while performing the gate-to-source over voltage protection for its load driving field-effect transistor. A Zener function device is connected between the gate and the source of the load driving field-effect transistor, and an on/off-switch circuit to supply either on-potential or off-potential to the gate of the field effect transistor is provided. The current flowing through the Zener function device when the load driving field-effect transistor is conductive is limited by the on/off-switch circuit.

18 Claims, 7 Drawing Sheets

LOAD DRIVE CIRCUIT

BACKGROUND OF THE INVENTION

1. Field of the Invention

The present invention relates to a load drive circuit that drives a load thereby controlling its output voltage.

2. Description of the Related Art

Drive circuits using a MOS-type output are known which control the drive of general electric apparatuses. In the drive circuits using a MOS-type output, protection is required with respect to the gate to source or drain to source withstand voltage of the output MOS transistors. For example, a protection circuit is known which is a series circuit of serially connected Zener diodes, connected between the gate and source of a MOS transistor for the over voltage protection. This type of protection circuit is described in Japanese Patent Application Kokai No. 2005-323489, (hereinafter called Reference 1).

The protection circuit described in Reference 1 comprises a MOSFET provided in between a battery and a load, and a series circuit having two Zener diodes serially connected between the gate and source of the MOSFET, and further having a transistor. When an over-current flows and thus the gate-to-source voltage of the MOSFET exceeds a reference voltage, the transistor is controlled to be ON, thereby clamping the gate-to-source voltage of the MOSFET to the Zener voltage of the Zener diode to decrease the drive capacity of the load drive circuit, and thus the over-current is reduced to achieve the gate-to-source over voltage protection.

SUMMARY OF THE INVENTION

In the protection circuit described in Reference 1, the amount of electric charge that the MOSFET supplies to the load needs to be increased to drive the load at high speed. In order to increase the amount of electric charge, the amount of current driving the MOSFET needs to be further increased.

However, the current continues to flow during the load driving time, and hence if the MOSFET is driven with such a large current, the problem will occur that the consumption current of the semiconductor integrated circuit increases due to the presence of the current.

The present invention has been made in view of the above described background, and an object thereof is to provide a load drive circuit that can operate at high speed with low consumption current while performing the gate-to-source over voltage protection for its load driving field-effect transistor.

To solve the above problem, there is provided a load drive circuit comprising a field effect transistor having a source connected to a power supply voltage or a reference potential and a drain; an output terminal connected to the drain of the field effect transistor; a Zener function device connected between a gate and the source of the field effect transistor; and an on/off-switch circuit connected between the power supply voltage and the reference potential to give either on-potential or off-potential to the gate of the field effect transistor. The on/off-switch circuit comprises an off-switch transistor having a source and a drain connected respectively to input and output terminals of the Zener function device; a series circuit of a first on-switch transistor and a current source, which circuit is connected between the gate and one of the power supply voltage and the reference potential; and a second on-switch transistor connected in parallel with the series circuit.

The load drive circuit may further comprise a control part to stop the second on-switch transistor when the gate-to-source voltage of the field effect transistor exceeds a predetermined value.

Moreover, the field effect transistor may be either a P-type MOS transistor or an N-type MOS transistor. The off-switch transistor may be a MOS transistor of the same type as the field effect transistor, and the two on-switch transistors may be MOS transistors of the other type than that of the field effect transistor.

Further, the Zener function device may be a Zener diode. Alternatively, the Zener function device may comprise a bipolar transistor and a voltage divider connected between the collector and emitter of the bipolar transistor to supply a divided voltage to the base of the bipolar transistor.

In the load drive circuit of the present invention, a Zener function device is connected between the gate and the source of its load driving field-effect transistor, and an on/off-switch circuit to supply either on-potential or off-potential to the gate of the field effect transistor is provided. The current flowing through the Zener function device when the load driving field-effect transistor is conductive is limited by the on/off-switch circuit, and thereby the load drive circuit can operate at high speed with low consumption current while performing the gate-to-source over voltage protection for the load driving field-effect transistor.

DETAILED DESCRIPTION OF THE INVENTION

Embodiments of the present invention will be described in detail below with reference to the accompanying drawings.

The configuration of a load drive circuit 10 according to an embodiment of the present invention will be described in detail with reference to FIG. 1.

Figure 1:
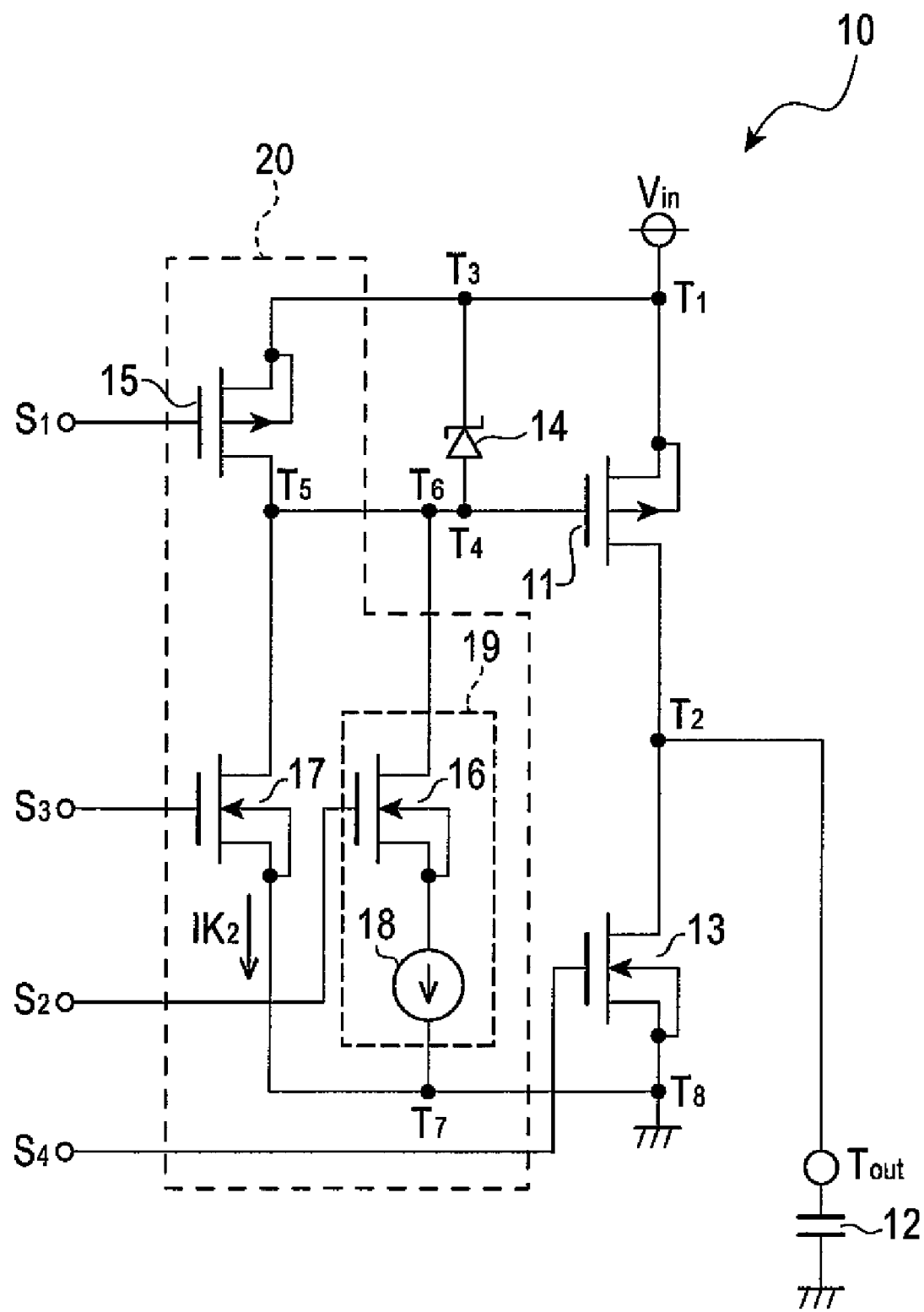
FIG. 1 is a configuration diagram of a load drive circuit according to an embodiment of the present invention.

As shown in FIG. 1, the source of a P-type MOS transistor 11 is connected via a connection point $T_1$ to a power supply voltage source $V_{in}$, and the drain thereof is connected via a connection point $T_2$ to an output terminal $T_{out}$. The output terminal $T_{out}$ is connected via a load 12 to a reference potential. The reference potential may be ground potential. Further, the drain of the P-type MOS transistor 11 is connected via the connection point $T_2$ to the drain of an N-type MOS transistor 13. Thus the load 12 is driven by driving the P-type MOS transistor 11 and the N-type MOS transistor 13, so that a predetermined drive voltage is output through the output terminal $T_{out}$.

A Zener diode 14, as a Zener function device, is connected between the gate and source of the P-type MOS transistor 11. Specifically, the cathode of the Zener diode 14 is connected via the connection point $T_1$ and a connection point $T_3$ to the source of the P-type MOS transistor 11, and the anode of the Zener diode 14 is connected via a connection point $T_4$ to the gate of the P-type MOS transistor 11. The Zener function device refers to a device capable of conducting a current in a reverse direction when its reverse voltage exceeds a predetermined voltage and, not being limited to a Zener diode, may be a series circuit of a Zener diode and a usual diode, or a combined circuit of a bipolar transistor and a voltage divider.

A P-type MOS transistor 15, as an off-switch transistor to stop the drive of the P-type MOS transistor 11, is connected in parallel with the Zener diode 14. Specifically, the source of the P-type MOS transistor 15 is connected via the connection point $T_3$ to the cathode of the Zener diode 14 and the drain thereof is connected via the connection point $T_4$ and connection points $T_5$, $T_6$ to the anode of the Zener diode 14 and to the gate of the P-type MOS transistor 11. Also, the source of the P-type MOS transistor 15 is connected via the connection points $T_1$, $T_3$ to the power supply voltage source $V_{in}$. Further, the gate of the P-type MOS transistor 15 is connected to an input terminal $S_1$ through which to input a gate drive signal for the P-type MOS transistor 15.

N-type MOS transistors 16, 17, as on-switch transistors to start driving the P-type MOS transistor 11, are connected between the gate of the P-type MOS transistor 11 and the reference potential. Specifically, the drain of the N-type MOS transistor 16 is connected via the connection points $T_4$, $T_6$ to the gate of the P-type MOS transistor 11, and the drain of the N-type MOS transistor 17 is connected via the connection points $T_4$, $T_5$, and $T_6$ to the gate of the P-type MOS transistor 11. Further, the source of the N-type MOS transistor 16 is connected via a current source 18 and then via connection points $T_7$, $T_8$ to the reference potential, and the source of the N-type MOS transistor 17 is connected to the reference potential via the connection points $T_7$, $T_8$. Further, the gates of the N-type MOS transistors 16, 17 are connected respectively to input terminals $S_2$, $S_3$ through which to input gate drive signals for the N-type MOS transistors. The N-type MOS transistor 16 and the current source 18 form a series circuit 19, and the N-type MOS transistor 17 is connected in parallel with the series circuit 19.

The P-type MOS transistor 15, the N-type MOS transistors 16, 17, and the current source 18 form an on/off-switch circuit 20 to drive and control the P-type MOS transistor 11. By driving the P-type MOS transistor 15 and the N-type MOS transistors 16, 17 individually, either on-potential or off-potential is given to the P-type MOS transistor 11. The on/off-switch circuit 20 with the above configuration is connected between the power supply voltage source $V_{in}$ and the reference potential.

In the above configuration, no input terminal through which to input a gate drive signal is connected to the gate of the P-type MOS transistor 11. Meanwhile, an input terminal $S_4$ to input a gate drive signal is connected to the gate of the N-type MOS transistor 13. Further, the source of the N-type MOS transistor 13 is connected to the reference potential via the connection point $T_8$.

The input terminals $S_1$ to $S_4$ are connected to an input signal control apparatus (not shown), which inputs a gate drive signal of a high level (Hi) or a low level (Lo) to the gate of each MOS transistor at predetermined timings.

Figure 2:
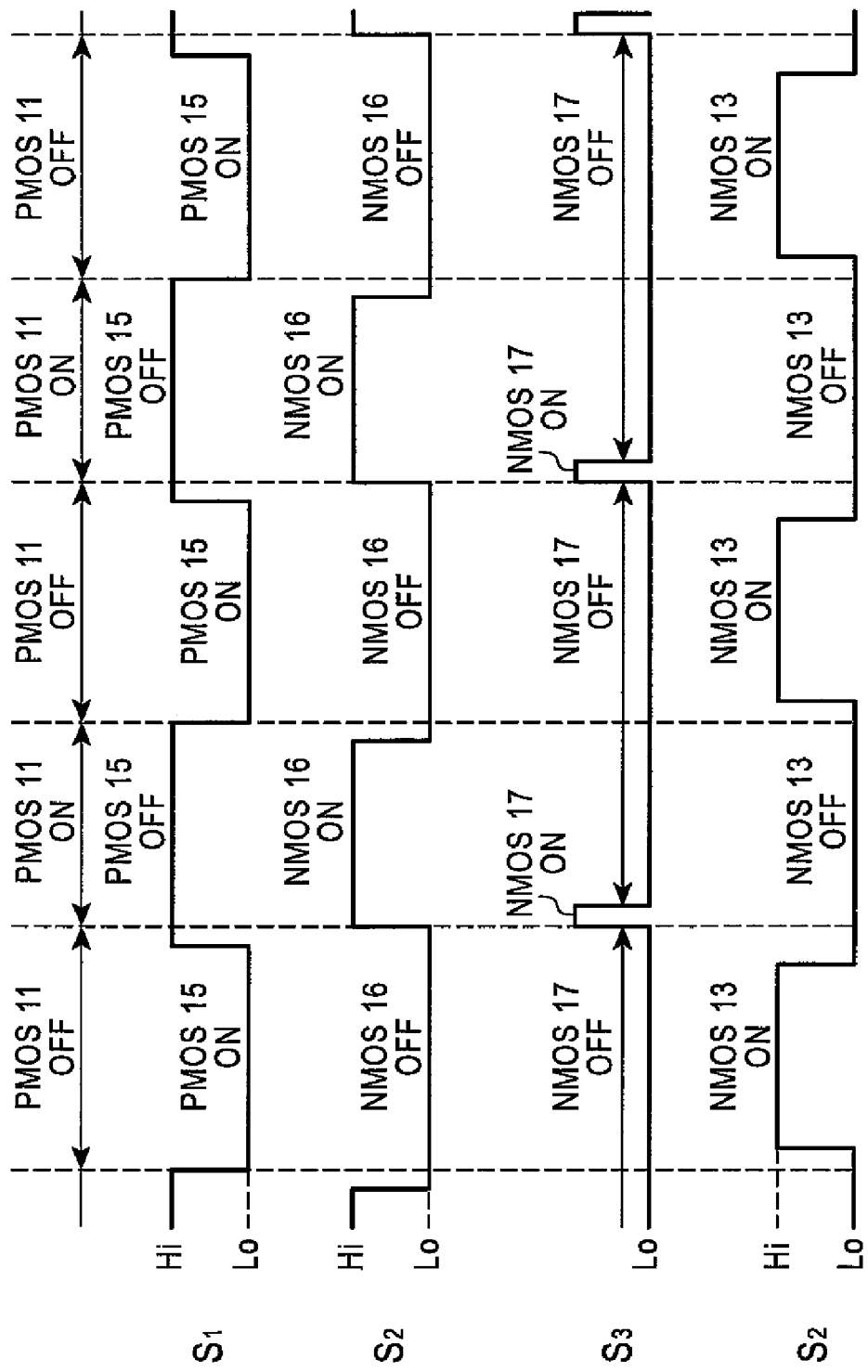
FIG. 2 is a time chart showing the operation of the load drive circuit according to the embodiment of the present invention.

Next, the operation of the load drive circuit 10 will be described in detail with reference to the time chart of FIG. 2.

Its initial state is defined to be the state where the gate drive signals input to the input terminals $S_1$, $S_2$, $S_3$ are at Lo and where the gate drive signal input to the input terminal $S_4$ is at Hi. In this state, the P-type MOS transistor 15 is ON and the N-type MOS transistors 16, 17 are OFF. Thus, a gate drive signal of Hi is input to the gate of the P-type MOS transistor 11, and hence the P-type MOS transistor 11 becomes OFF. Further, because a gate drive signal of Hi is input to the input terminal $S_4$, the N-type MOS transistor 13 is ON. In this state, no charge can be supplied to the load 12, which means the load drive circuit 10 being stopped, and thus the output voltage on the output terminal $T_{out}$ is at Lo.

Then, the gate drive signal input to the input terminal $S_4$ becomes Lo, thus rendering the N-type MOS transistor 13 OFF. Thereafter, the gate drive signal input to the input terminal $S_1$ becomes Hi, and then the gate drive signals input to the input terminals $S_2$, $S_3$ simultaneously become Hi. That is, immediately after the P-type MOS transistor 15 is rendered OFF, the N-type MOS transistors 16, 17 are rendered ON. When the N-type MOS transistors 16, 17 are rendered ON, i.e., conductive, a plus charge stored in between the gate of the P-type MOS transistor 11 and the drain of the P-type MOS transistor 15 flows to the reference potential, and thus the potential on the gate of the P-type MOS transistor 11 decreases. Thus, a gate drive signal of Lo is input to the gate of the P-type MOS transistor 11, hence rendering the P-type MOS transistor 11 ON.

Here, because the series circuit 19 includes the current source 18, a greater amount of current than a predetermined amount of current determined by the current source 18 does not flow through it. In contrast, because a thing to control the amount of current such as a current source is not connected to the N-type MOS transistor 17, the current flowing from the drain to source of the N-type MOS transistor 17 is larger than the current flowing through the series circuit 19. Therefore, the gate potential of the P-type MOS transistor 11 can be rapidly decreased by the drive of the N-type MOS transistor 17, and thus the P-type MOS transistor 11 can be driven at high speed.

When the P-type MOS transistor 11 is rendered ON, the P-type MOS transistor 11 becomes conductive for a current between the source and drain, and hence a load current IL starts flowing. The load current IL flows via the connection point $T_2$ to the load 12, thus charging the load 12 with an electric charge to make the output voltage on the output terminal $T_{out}$ be at Hi.

Further, when the P-type MOS transistor 11 is rendered ON, the gate-to-source voltage $V_{gs}$ of the P-type MOS transistor 11 increases to reach the Zener voltage $V_z$ of the Zener diode 14, in which state the gate drive signal input to the input terminal $S_3$ becomes Lo, thereby rendering the N-type MOS transistor 17 OFF. In this state, a drive current IK flows from the power supply voltage source $V_{in}$ via the Zener diode 14 and the series circuit 19 to the reference potential as well as the load current IL flowing from the power supply voltage source $V_{in}$ via the P-type MOS transistor 11 to the reference potential. Because the drive current IK flows, the gate-to-source voltage $V_{gs}$ of the P-type MOS transistor 11 is prevented from increasing rapidly (that is, the gate-to-source protection against high voltage) with the Zener voltage $V_z$ of the Zener diode 14 being maintained, thus maintaining the P-type MOS transistor 11 ON to hold the output voltage on the output terminal $T_{out}$ at Hi. That is, when driving the P-type MOS transistor 11, by driving the N-type MOS transistor 16 allowing a very small current (namely, a current determined by the current source 18) to flow and the N-type MOS transistor 17 allowing a large current (namely, a current larger than the current determined by the current source 18) to flow, the P-type MOS transistor 11 is driven at high speed, and when the gate-to-source voltage $V_{gs}$ reaches a predetermined voltage, only the N-type MOS transistor 16 is driven, thus allowing only the load current IL and drive current IK to flow in order to hold the output voltage at Hi.

The current source 18 provided in the series circuit 19 controls the drive current IK to a minimum amount of current to hold the output voltage at Hi. Therefore, after the gate-to-source voltage $V_{gs}$ of the P-type MOS transistor 11 reaches the Zener voltage $V_z$, the output voltage is maintained at Hi with the minimum amount of current.

Thereafter, the gate drive signal input to the input terminal $S_2$ becomes Lo, thus rendering the N-type MOS transistor 16 OFF. Then, the gate drive signal input to the input terminal $S_1$ becomes Lo, thus rendering the P-type MOS transistor 15 ON. When the P-type MOS transistor 15 is rendered ON, the gate voltage of the P-type MOS transistor 11 is elevated due to the drain current of the P-type MOS transistor 15, thereby rendering the P-type MOS transistor 11 OFF.

After the P-type MOS transistor 11 is rendered OFF, the gate drive signal input through the input terminal $S_4$ becomes Hi, thus rendering the N-type MOS transistor 13 ON. By rendering the N-type MOS transistor 13 conductive for a current between the source and drain, the electric charge stored in the load 12 is discharged, and thus the output voltage on the output terminal $T_{out}$ becomes Lo.

Thereafter, by repeating the above operation, the output voltage can be switched periodically through the drive of the load drive circuit 10.

As such, the load drive circuit of the present embodiment can operate at high speed with low consumption current while performing the gate-to-source over voltage protection for the P-type MOS transistor.

With the configuration other than the input terminal $S_3$ being the same as the above embodiment 1, a control circuit to determine the timings at which to render the N-type MOS transistor 17 OFF may be provided. A load drive circuit 30 provided with this control circuit will be described in detail with reference to FIG. 3. The same reference numerals are used to denote the same or like parts as in the above embodiment 1 with description thereof being omitted.

Figure 3:
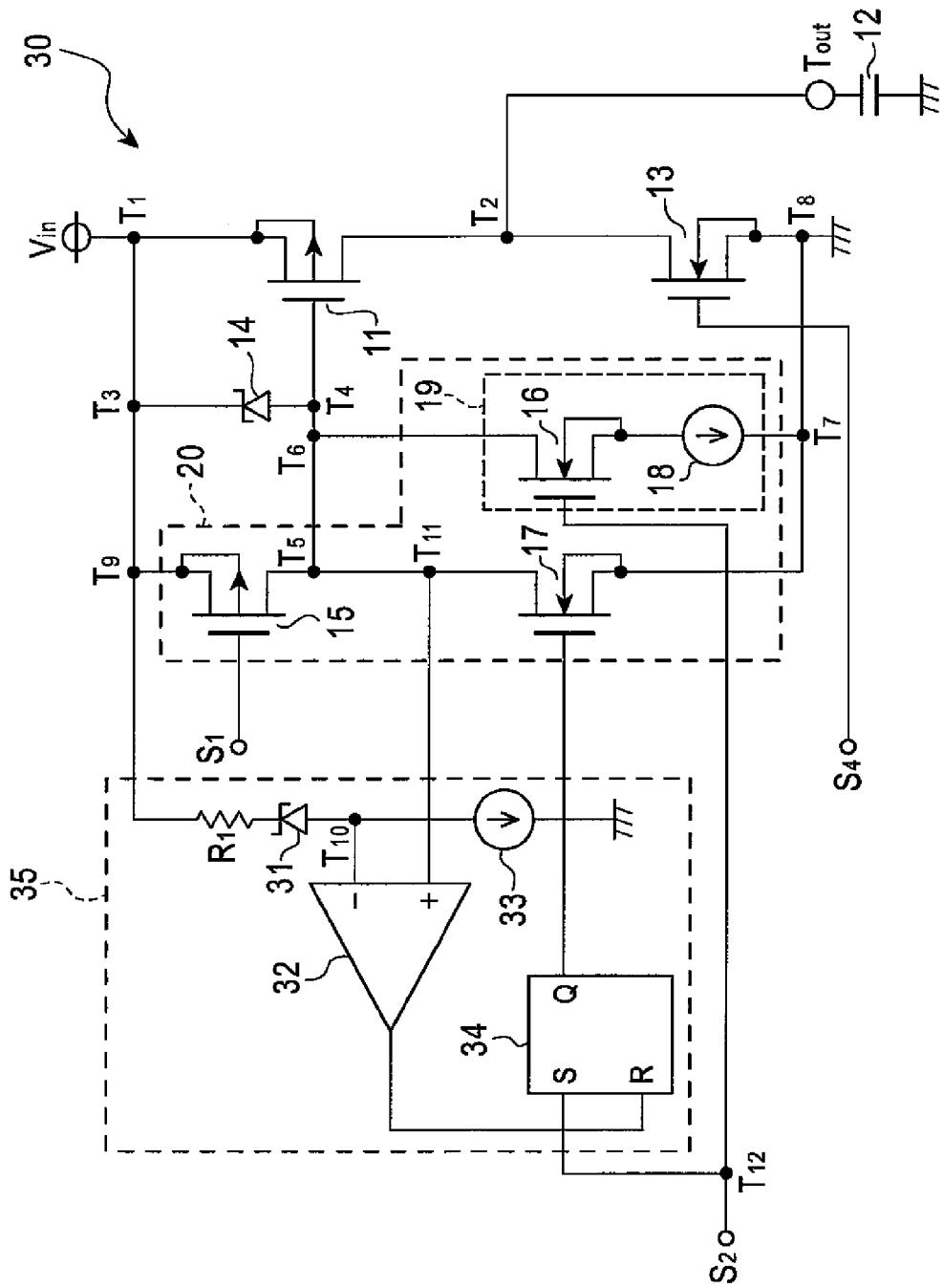
FIG. 3 is a configuration diagram of a load drive circuit according to another embodiment of the present invention.

As shown in FIG. 3, the source of the P-type MOS transistor 15 is connected via a connection point $T_9$ to a resistor $R_1$. The other end of the resistor $R_1$ from the end connected to the source of the P-type MOS transistor 15 is connected to the cathode of a Zener diode 31. The anode of the Zener diode 31 is connected via a connection point $T_{10}$ to the negative input terminal of a comparator 32. Further, the anode of the Zener diode 31 is connected via the connection point $T_{10}$ to a current source 33. The other end of the current source 33 from the end connected to the anode of the Zener diode 31 is connected to the reference potential. The positive input terminal of the comparator 32 is connected via a connection point $T_{11}$ to the drain of the P-type MOS transistor 15 and the drain of the N-type MOS transistor 17. The output terminal of the comparator 32 is connected to the reset input terminal R of a flip-flop circuit 34. The set input terminal S of the flip-flop circuit 34 is connected via a connection point $T_{12}$ to the input terminal $S_2$. The output terminal Q of the flip-flop circuit 34 is connected to the gate of the N-type MOS transistor 17.

With the above configuration, the gate-to-source voltage $V_{gs}$ of the P-type MOS transistor 11 is input to the positive input terminal of the comparator 32, and a reference voltage $V_{ref}$ determined by the resistor $R_1$, the Zener diode 31, and the current source 33 is input to the negative input terminal thereof. The resistor $R_1$, the Zener diode 31, the comparator 32, the current source 33, and the flip-flop circuit 34 form a control circuit 35.

Figure 4:
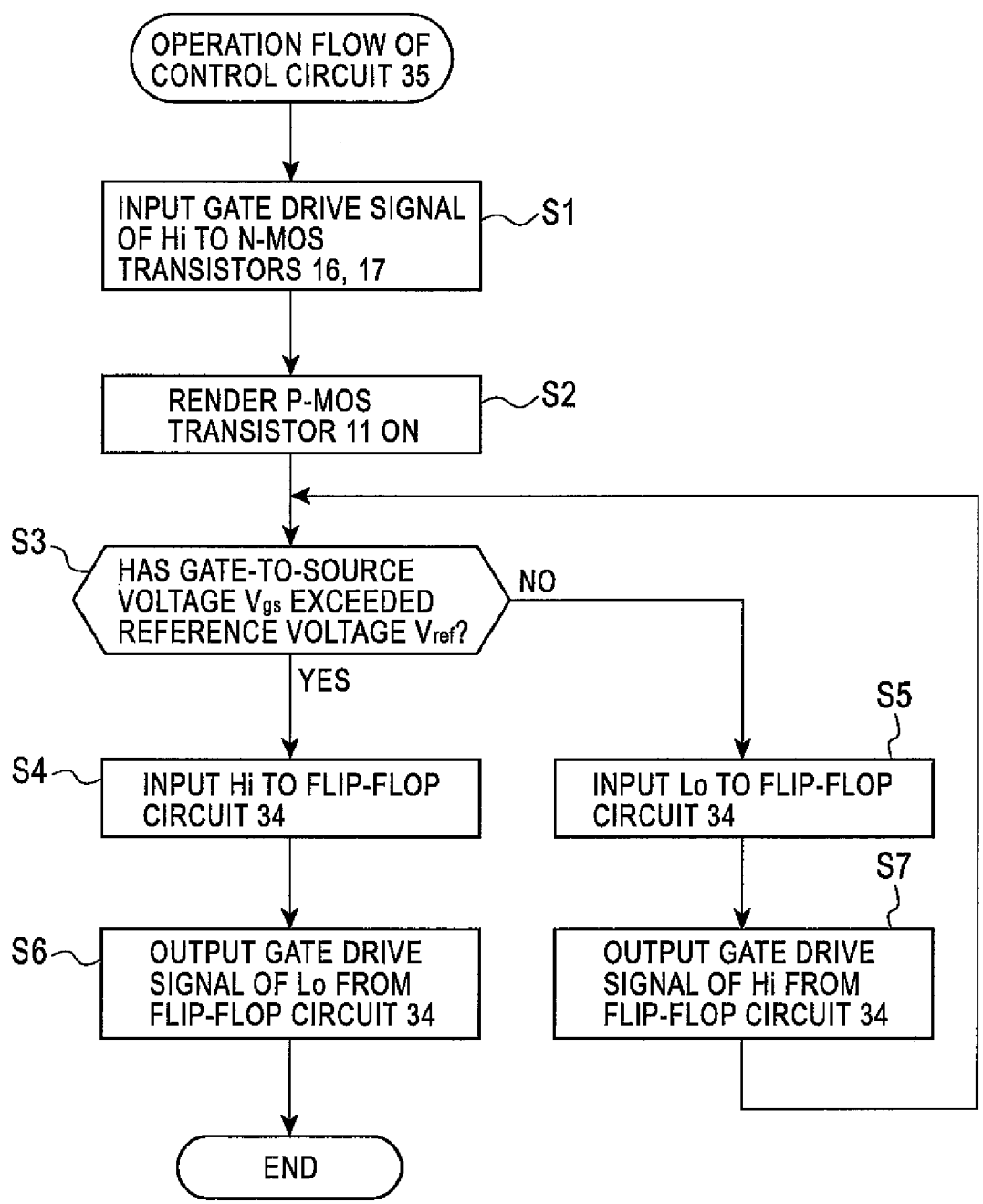
FIG. 4 is a flow chart showing the operation of a control circuit of the load drive circuit according to the other embodiment of the present invention.

Next, the operation of the control circuit 35 will be described with reference to FIG. 4.

A gate drive signal of Hi is input through the input terminal $S_2$ to the N-type MOS transistors 16, 17, rendering the N-type MOS transistors 16, 17 ON (step S1). Here, as to the N-type MOS transistor 17, the gate drive signal of Hi is input thereto via the flip-flop circuit 34. At this time, since a gate drive signal of Hi is input through the input terminal $S_1$, the P-type MOS transistor 15 is OFF. Further, since a gate drive signal of Lo is input through the input terminal $S_4$, the N-type MOS transistor 13 is OFF.

When the N-type MOS transistors 16, 17 become ON, the P-type MOS transistor 11 is rendered ON (step S2). Thereafter, it is determined by the comparator 32 whether the gate-to-source voltage $V_{gs}$ of the P-type MOS transistor 11 exceeds the reference voltage $V_{ref}$ determined by the resistor $R_1$, the Zener diode 31, and the current source 33 (step S3).

If the gate-to-source voltage $V_{gs}$ is higher than the reference voltage $V_{ref}$, the level of Hi is input to the reset input terminal R of the flip-flop circuit 34 (step S4). On the other hand, if the gate-to-source voltage $V_{gs}$ is lower than the reference voltage $V_{ref}$, the level of Lo is input to the reset input terminal R of the flip-flop circuit 34 (step S5).

When the level of Hi is input to the reset input terminal R, the flip-flop circuit 34 outputs a gate drive signal of Lo through the output terminal Q, thus rendering the N-type MOS transistor 17 OFF (step S6). Then, the process proceeds to the END.

When the level of Lo is input to the reset input terminal R, the flip-flop circuit 34 continues to output a gate drive signal of Hi through the output terminal Q, thus maintaining the N-type MOS transistor 17 ON (step S7). Then, the process proceeds to step S3, where the gate-to-source voltage $V_{gs}$ and the reference voltage $V_{ref}$ are compared again.

As such, in the present embodiment, because the control circuit 35 is provided, when the gate-to-source voltage $V_{gs}$ of the P-type MOS transistor 11 exceeds the reference voltage $V_{ref}$, the N-type MOS transistor 17 is rendered OFF, and hence wasteful consumption current can be reduced further than with the embodiment 1. Note that the time chart of the drive states of the load drive circuit 30 is the same as shown in FIG. 2.

In the embodiments 1 and 2, by connecting an on/off-switch circuit to the P-type MOS transistor, the P-type MOS transistor is enabled to be driven at high speed. Meanwhile, by providing the N-type MOS transistor with an on/off-switch circuit, the transistor can be driven at high speed. A load drive circuit 50 with this configuration will be described in detail with reference to FIG. 5. The same reference numerals are used to denote the same or like parts as in the above embodiment 1 with description thereof being omitted.

Figure 5:
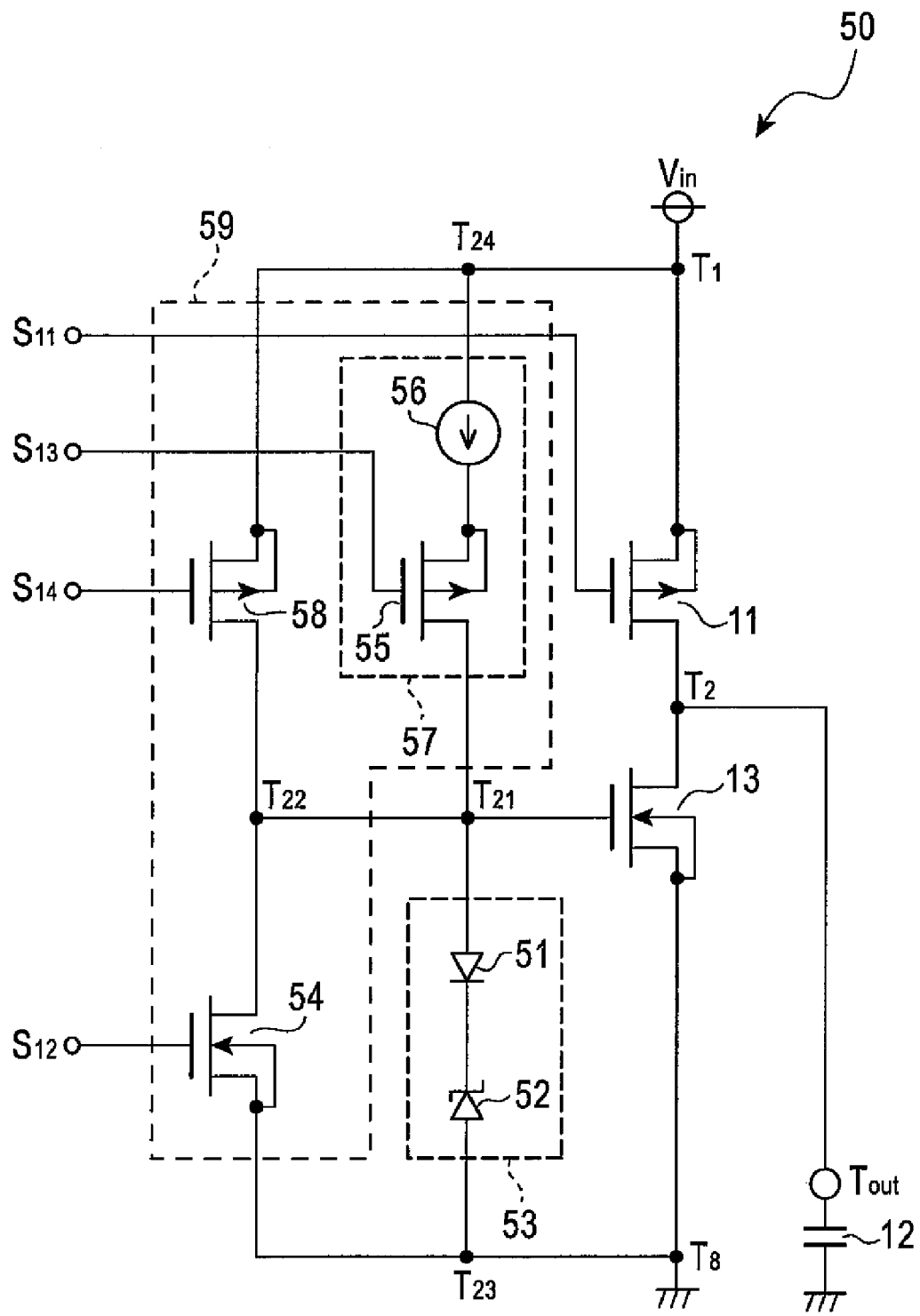
FIG. 5 is a configuration diagram of a load drive circuit according to another embodiment of the present invention.

As shown in FIG. 5, the gate of the P-type MOS transistor 11 is connected to an input terminal $S_{11}$. Thus the P-type MOS transistor 11 is driven according to a gate drive signal input through the input terminal $S_{11}$.

A Zener function device 53 consisting of a diode 51 and a Zener diode 52 serially connected is connected between the gate and source of the N-type MOS transistor 13. Further, an N-type MOS transistor 54, as an off-switch transistor to render the N-type MOS transistor 13 OFF, is connected in parallel with the Zener function device 53. Specifically, the drain of the N-type MOS transistor 54 is connected via connection points $T_{21}$, $T_{22}$ to the gate of the N-type MOS transistor 13, and the source thereof is connected via a connection point $T_{23}$ to the reference potential. Further, the gate of the N-type MOS transistor 54 is connected to an input terminal $S_{12}$, and the N-type MOS transistor 54 is driven according to a gate drive signal input through the input terminal $S_{12}$.

Further, a P-type MOS transistor 55, as an on-switch transistor to render the N-type MOS transistor 13 ON, is connected via the connection point $T_{21}$ to the gate of the N-type MOS transistor 13. The source of the P-type MOS transistor 55 is connected via a current source 56 and connection points $T_1$, $T_{24}$ to the power supply voltage source $V_{in}$. The P-type MOS transistor 55 and the current source 56 are serially connected and form a series circuit 57.

Moreover, a P-type MOS transistor 58, as an on-switch transistor to render the N-type MOS transistor 13 ON, is connected in parallel with the series circuit 57. Specifically, the source of the P-type MOS transistor 58 is connected via the connection points $T_1$, $T_{24}$ to the power supply voltage source $V_{in}$, and the drain thereof is connected via the connection points $T_{21}$, $T_{22}$ to the gate of the N-type MOS transistor 13.

The gates of the P-type MOS transistors 55, 58 are connected respectively to input terminals $S_{13}$, $S_{14}$ through which to input gate drive signals to drive them.

In the above configuration, the N-type MOS transistor 54, the P-type MOS transistor 55, the current source 56, and the P-type MOS transistor 58 form an on/off-switch circuit 59.

Figure 6:
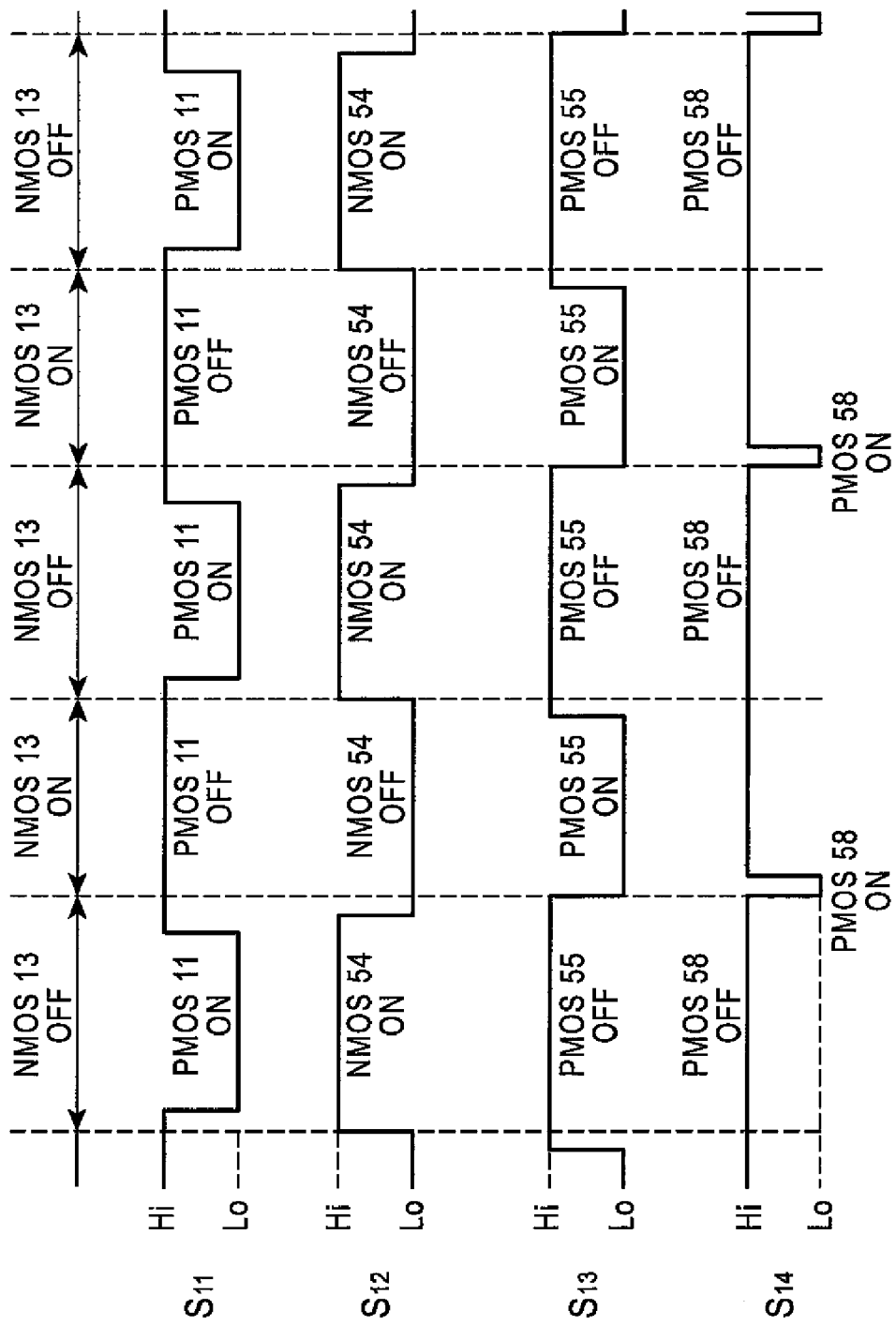
FIG. 6 is a time chart showing the operation of the load drive circuit according to the other embodiment of the present invention.

Next, the operation of the load drive circuit 50 will be described in detail with reference to the time chart of FIG. 6.

Its initial state is defined to be the state where the gate drive signal input to the input terminals $S_{11}$ is at Lo, and the gate drive signals input to the input terminals $S_{12}$, $S_{13}$, $S_{14}$ are at Hi. In this state, the P-type MOS transistor 11 and the N-type MOS transistor 54 are ON and the P-type MOS transistors 55, 58 are OFF. Thus, a gate drive signal of Lo is input to the gate of the N-type MOS transistor 13, and hence the N-type MOS transistor 13 becomes OFF. In this state, a load current IL flows from the power supply voltage source $V_{in}$ to the load 12, hence supplying the load 12 with an electric charge. Thus, the load drive circuit 50 is put in a driving state, so that the output voltage on the output terminal $T_{out}$ becomes Hi.

Then, the gate drive signal input to the input terminal $S_{11}$ becomes Hi, thus rendering the P-type MOS transistor 11 OFF. Thereafter, the gate drive signal input to the input terminal $S_{12}$ becomes Lo, and then the gate drive signals input to the input terminals $S_{13}$, $S_{14}$ simultaneously become Lo. That is, immediately after the N-type MOS transistor 54 is rendered OFF, the P-type MOS transistors 55, 58 are rendered ON. When the P-type MOS transistors 55, 58 are rendered ON, i.e., conductive, a current flows from the power supply voltage source $V_{in}$ to the gate of the N-type MOS transistor 13 via the series circuit 57 or the P-type MOS transistor 58, and thus the potential on the gate of the N-type MOS transistor 13 is elevated. Thus, a gate drive signal of Hi is input to the gate of the N-type MOS transistor 13, hence rendering the N-type MOS transistor 13 ON.

Here, because the series circuit 57 includes the current source 56, a predetermined amount of current flows through the series circuit 57. Meanwhile, because a thing to control the amount of current such as a current source is not connected to the P-type MOS transistor 58, the current flowing from the source to drain of the P-type MOS transistor 58 is larger than the current flowing through the series circuit 57. Therefore, the gate potential of the N-type MOS transistor 13 can be rapidly increased by the drive of the P-type MOS transistor 58, and thus the N-type MOS transistor 13 can be driven at high speed.

When the N-type MOS transistor 13 is rendered ON, the N-type MOS transistor 13 becomes conductive for a current between the source and drain, and hence the electric charge stored in the load 12 is discharged, and thus the output voltage on the output terminal $T_{out}$ becomes Lo.

Further, when the N-type MOS transistor 13 is rendered ON, the gate-to-source voltage $V_{gs}$ of the N-type MOS transistor 13 increases to reach a limiter voltage $V_1$ that is the sum of the Zener voltage $V_z$ of the Zener diode 52 and the anode-to-cathode voltage of the diode 51, in which state the gate drive signal input to the input terminal $S_{14}$ becomes Hi, thereby rendering the P-type MOS transistor 58 OFF. In this state, a drive current IK flows from the power supply voltage source $V_{in}$ via the series circuit 57 and the Zener function device 53 to the reference potential. Because the drive current IK flows, the gate-to-source voltage $V_{gs}$ of the N-type MOS transistor 13 is prevented from increasing rapidly (that is, the gate-to-source protection against high voltage) with the limiter voltage $V_1$ of the Zener function device 53 being maintained, thus maintaining the N-type MOS transistor 13 ON to hold the output voltage on the output terminal $T_{out}$ at Lo.

The current source 56 provided in the series circuit 57 controls the drive current IK to a minimum amount of current to hold the output voltage at Lo. Therefore, after the gate-to-source voltage $V_{gs}$ of the N-type MOS transistor 13 reaches the limiter voltage $V_1$, the output voltage is maintained at Lo with the minimum amount of current.

Thereafter, the gate drive signal input through the input terminal $S_{13}$ becomes Hi, thus rendering the P-type MOS transistor 55 OFF. Then, the gate drive signal input through the input terminal $S_{12}$ becomes Hi, thus rendering the N-type MOS transistor 54 ON. When the N-type MOS transistor 54 is rendered ON, the gate voltage of the N-type MOS transistor 13 is decreased, thereby rendering the N-type MOS transistor 13 OFF.

After the N-type MOS transistor 13 is rendered OFF, the gate drive signal input through the input terminal $S_{11}$ becomes Lo, thus rendering the P-type MOS transistor 11 ON. The load 12 is again supplied with electric charge, and thus the output voltage on the output terminal $T_{out}$ becomes Hi. Thereafter, by repeating the above operation, the output voltage can be switched periodically through the drive of the load drive circuit 50.

As such, the load drive circuit of the present embodiment can operate at high speed with low consumption current while performing the gate-to-source over voltage protection for the N-type MOS transistor.

Each of the two MOS transistors to drive the load may be provided with an on/off-switch circuit. With this configuration, at both the start and the stop of driving the load, it is possible to operate at high speed with low consumption current while performing the over voltage protection.

The Zener function device is not limited to those of the embodiments 1 and 3, and another example thereof will be described in detail with reference to FIG. 7. The same reference numerals are used to denote the same or like parts as in the above embodiment 3 with description thereof being omitted.

Figure 7:
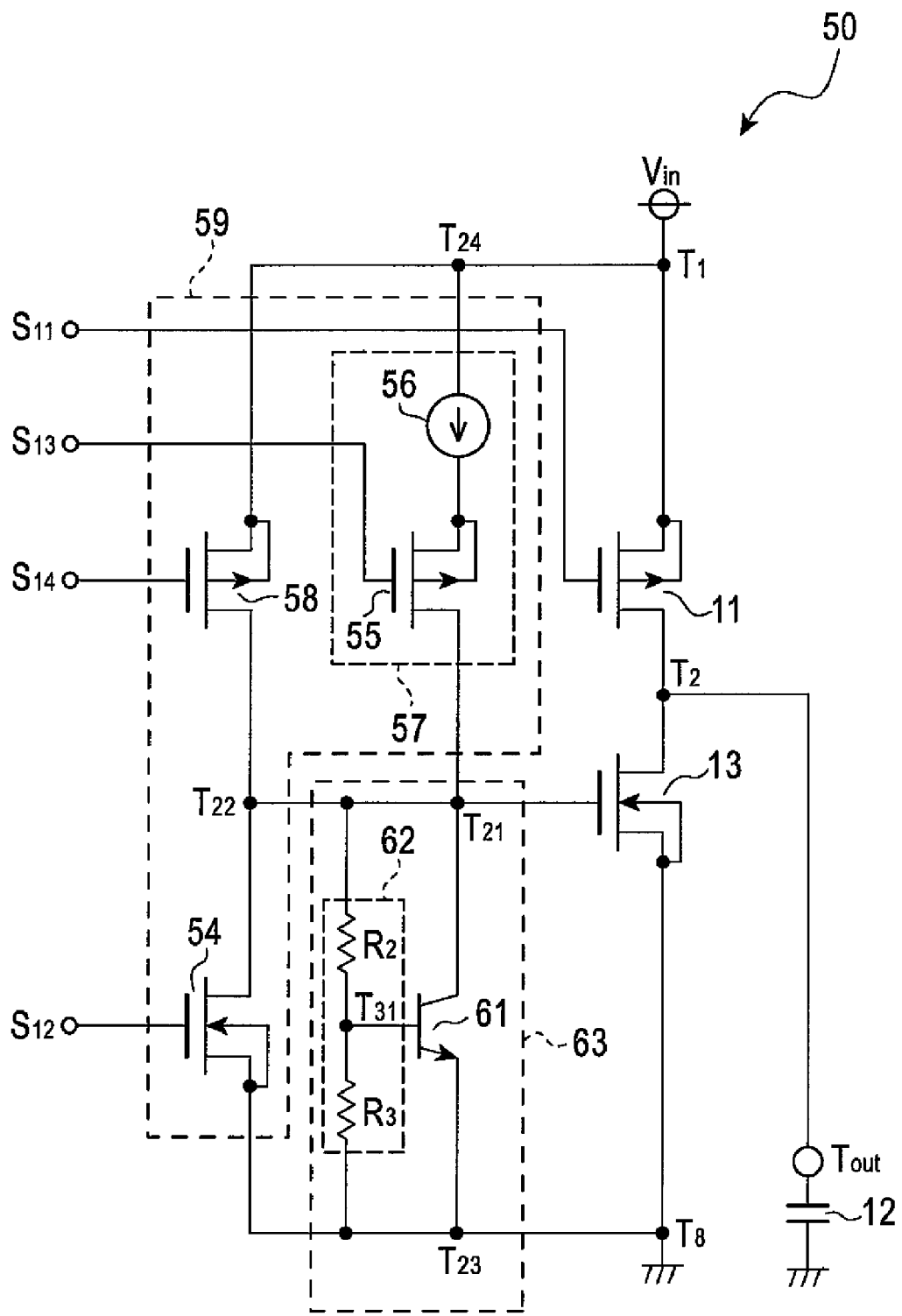
FIG. 7 is a configuration diagram of a load drive circuit according to another embodiment of the present invention.

As shown in FIG. 7, a bipolar transistor 61 is connected between the gate and source of the N-type MOS transistor 13. A voltage divider 62 of serially connected resistors $R_2$, $R_3$ is connected between the collector and emitter of the bipolar transistor 61, and the resistors $R_2$, $R_3$ are connected via their connection point $T_{31}$ to the base of the bipolar transistor 61. Thus, a divided voltage determined by the resistors $R_2$, $R_3$ is supplied to the base of the bipolar transistor 61. The resistors $R_2$, $R_3$ and the connection point $T_{31}$ are connected to the base of the bipolar transistor 61. The bipolar transistor 61 and the voltage divider 62 form a Zener function device 63.

With the above configuration, when the gate-to-source voltage $V_{gs}$ of the N-type MOS transistor 13 reaches the limiter voltage $V_1$ of the Zener function device 63 determined by the resistors $R_2$, $R_3$, the bipolar transistor 61 becomes conductive, and a current starts flowing through the bipolar transistor.

As such, with the Zener function device for the load drive circuit in the present embodiment, the over voltage protection is possible.

This application is based on Japanese Patent Application No. 2007-320808 which is hereby incorporated by reference.

What is claimed is:

1. A load drive circuit comprising:
   a field effect transistor having a source connected to a power supply voltage or a reference potential and a drain;
   an output terminal connected to the drain of said field effect transistor;
   a Zener function device connected between a gate and the source of said field effect transistor; and
   an on/off-switch circuit connected between said power supply voltage and said reference potential to give either on-potential or off-potential to the gate of said field effect transistor,
   wherein said on/off-switch circuit comprises an off-switch transistor having a source and a drain connected respectively to input and output terminals of said Zener function device; a series circuit of a first on-switch transistor and a current source, which circuit is connected between said gate and one of said power supply voltage and said reference potential; and a second on-switch transistor connected in parallel with said series circuit.

2. A load drive circuit according to claim 1, further comprising a control unit to stop said second on-switch transistor when the gate-to-source voltage of said field effect transistor exceeds a predetermined value.

3. A load drive circuit according to claim 1, wherein said field effect transistor is either a P-type MOS transistor or an N-type MOS transistor.

4. A load drive circuit according to claim 2, wherein said field effect transistor is either a P-type MOS transistor or an N-type MOS transistor.

5. A load drive circuit according to claim 3, wherein said off-switch transistor is a MOS transistor of the same type as said field effect transistor, and said two on-switch transistors are MOS transistors of the other type than that of said field effect transistor.

6. A load drive circuit according to claim 4, wherein said off-switch transistor is a MOS transistor of the same type as said field effect transistor, and said two on-switch transistors are MOS transistors of the other type than that of said field effect transistor.

7. A load drive circuit according to claim 1, wherein said Zener function device is a Zener diode.

8. A load drive circuit according to claim 2, wherein said Zener function device is a Zener diode.

9. A load drive circuit according to claim 3, wherein said Zener function device is a Zener diode.

10. A load drive circuit according to claim 4, wherein said Zener function device is a Zener diode.

11. A load drive circuit according to claim 5, wherein said Zener function device is a Zener diode.

12. A load drive circuit according to claim 6, wherein said Zener function device is a Zener diode.

13. A load drive circuit according to claim 1, wherein said Zener function device comprises a bipolar transistor and a voltage divider connected between the collector and emitter of said bipolar transistor to supply a divided voltage to the base of said bipolar transistor.

14. A load drive circuit according to claim 2, wherein said Zener function device comprises a bipolar transistor and a voltage divider connected between the collector and emitter of said bipolar transistor to supply a divided voltage to the base of said bipolar transistor.

15. A load drive circuit according to claim 3, wherein said Zener function device comprises a bipolar transistor and a voltage divider connected between the collector and emitter of said bipolar transistor to supply a divided voltage to the base of said bipolar transistor.

16. A load drive circuit according to claim 4, wherein said Zener function device comprises a bipolar transistor and a voltage divider connected between the collector and emitter of said bipolar transistor to supply a divided voltage to the base of said bipolar transistor.

17. A load drive circuit according to claim 5, wherein said Zener function device comprises a bipolar transistor and a voltage divider connected between the collector and emitter of said bipolar transistor to supply a divided voltage to the base of said bipolar transistor.

18. A load drive circuit according to claim 6, wherein said Zener function device comprises a bipolar transistor and a voltage divider connected between the collector and emitter of said bipolar transistor to supply a divided voltage to the base of said bipolar transistor.

\* \* \* \* \*